(12) United States Patent
Teboulle

(10) Patent No.: US 11,402,417 B2
(45) Date of Patent: Aug. 2, 2022

(54) DETECTION OF ENERGY-CONSUMPTION FRAUD IN AN ELECTRICAL DISTRIBUTION SERVICE

(71) Applicant: SAGEMCOM ENERGY & TELECOM SAS, Rueil Malmaison (FR)

(72) Inventor: Henri Teboulle, Rueil Malmaison (FR)

(73) Assignee: SAGECOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 17/601,629

(22) PCT Filed: Apr. 3, 2020

(86) PCT No.: PCT/EP2020/059590
§ 371 (c)(1),
(2) Date: Oct. 5, 2021

(87) PCT Pub. No.: WO2020/207922
PCT Pub. Date: Oct. 15, 2020

(65) Prior Publication Data
US 2022/0146558 A1    May 12, 2022

(30) Foreign Application Priority Data
Apr. 8, 2019   (FR) ...................................... 1903749

(51) Int. Cl.
*G01R 22/06*   (2006.01)
(52) U.S. Cl.
CPC ................................. *G01R 22/066* (2013.01)
(58) Field of Classification Search
CPC .......... G01R 22/00–10; G01D 4/00–18; Y04S 20/30
See application file for complete search history.

(56) References Cited

U.S. PATENT DOCUMENTS

| 8,461,823 B2 | 6/2013 | de Buda |
| 2014/0072059 A1* | 3/2014 | Krishnan ............... G01D 4/002 375/257 |

(Continued)

FOREIGN PATENT DOCUMENTS

FR   3025600 A1   3/2016

OTHER PUBLICATIONS

May 11, 2020 International Search Report issued in International Patent Application No. PCT/EP2020/059590.

*Primary Examiner* — Huy Q Phan
*Assistant Examiner* — David B Frederiksen
(74) *Attorney, Agent, or Firm* — Oliff PLC

(57) ABSTRACT

A centralising meter is connected to a data concentrator via a first powerline communication network and to remote basic meters via a second powerline communication network. The centralising meter emulates a smart electricity meter application with respect to the data concentrator for each remote basic meter, in order in particular to construct a corresponding load curve. When the ratio of an energy consumption declared by all the remote basic meters to an energy consumption measured by the centralising meter is below a predefined threshold and when furthermore a plurality of load curves show a drop to zero, a fraud is detected. The centralising meter compares total energy consumptions estimated from extrapolations of certain load curves with the measured energy consumption, to identify which remote basic meter is subject to the fraud.

9 Claims, 6 Drawing Sheets

(56) References Cited

U.S. PATENT DOCUMENTS

| | | | |
|---|---|---|---|
| 2014/0340236 A1* | 11/2014 | Rhoads | G06Q 50/06 340/870.02 |
| 2014/0375474 A1* | 12/2014 | Dietrich | G06F 21/57 340/870.02 |
| 2015/0149396 A1 | 5/2015 | Arya et al. | |
| 2015/0276890 A1* | 10/2015 | Turner | G01N 27/42 324/764.01 |
| 2017/0082665 A1 | 3/2017 | Bandyopadhyay et al. | |

* cited by examiner

DETECTION OF ENERGY-CONSUMPTION FRAUD IN AN ELECTRICAL DISTRIBUTION SERVICE

TECHNICAL FIELD

The present invention relates to automated metering management (AMM) systems in an electrical distribution service and more particularly detections of energy-consumption fraud.

PRIOR ART

Powerline communication networks for automated metering management AMM have appeared during the past years, in particular in the context of electrical distribution services. Mention can be made for example of the G3-PLC standard specified in the ITU-T recommendation G.9903. In such powerline communication networks, communications are established between electricity meters, referred to as smart electricity meters, and a concentrator node, sometimes referred to as a data concentrator or base node or coordinator, to allow in particular remote automated reading of electrical consumption measurements made by said smart electricity meters and in general terms to enable electricity meters to be taken control of remotely. A plurality of data concentrators are then geographically deployed to distribute the load of collecting metering readings from the smart electricity meters. Each data concentrator then serves as a relay between the smart electricity meters and an entity managing the automated metering management system AMM that is responsible for processing the metering readings in a centralised manner.

Thus smart electricity meters are becoming more autonomous and make it possible to avoid an employee of the electricity distribution operator going to a home to make metering readings regularly. On the other hand, the internal architecture of the electricity meters is becoming more complex, which increases the design, manufacturing and maintenance cost. This is because such smart electricity meters comprise two controllers: a first controller dedicated to the metrology operations for metering energy consumption and a second controller dedicated to the applicative operations, namely the user-interface management, calendar and load curve management, quality-management and anti-fraud operations; and, especially, the management of communications in the automated metering management system AMM. This is because managing communications in the automated metering management system AMM is based on applicative encapsulations typically in accordance with the DLMS/COSEM standard ("Device Language Message Specification/Companion Specification for Energy Metering"), as described in the normative document IEC 62056-5-3 and in the $12^{th}$ edition of the document "Bluebook: COSEM Interface Classes and OBIS Object Identification System" published by the DLMS User Association, which requires sizeable processing resources in the smart electricity meters.

To overcome these drawbacks, it is possible to concentrate the applicative aspects of a plurality of electricity meters in one and the same centralising meter. This centralising meter then fulfils a role of proxy for said plurality of electricity meters. The centralising meter can then communicate much more simply with the electricity meters of said plurality than with the rest of the automated metering management system AMM, by eliminating in particular at the electricity meters of said plurality the needs for applicative encapsulations mentioned above. This makes it possible to reduce the requirement for processing resources of the electricity meters in question and therefore to simplify the design thereof and to reduce the manufacturing and maintenance costs thereof. Then remote basic meters are then spoken of, which are essentially responsible for performing metrological operations and for responding to a simple set of atomic commands.

However, it is necessary to be able to detect situations of energy-consumption fraud, despite this structural simplification of the electricity meters enabled by the establishment of this centralising meter. Energy-consumption fraud involves a declaration of zero consumption whereas the electrical installation concerned is manifestly consuming electrical energy. It is in particular desirable to provide a solution that makes it possible to easily identify where the fraud is located among the remote basic meters, without having to increase their requirements for processing resources (otherwise this would be contrary to the objective achieved by the establishment of the centralising meter).

DISCLOSURE OF THE INVENTION

One object of the present invention is to propose a method implemented by a device, called a centralising meter, included in an automated metering management system in the context of an electrical distribution service, the centralising meter comprising a first powerline communication unit configured for communicating with a data concentrator via a first powerline communication network in a first frequency band and a second powerline communication unit configured for communicating with a plurality of devices, called remote basic meters, via a second powerline communication network in a second frequency band distinct from the first frequency band. The method comprises the following steps: emulating a smart electricity meter application with respect to the data concentrator for each remote basic meter registered with the centralising meter via the second powerline communication network, each emulated application constructing a load curve for the corresponding remote basic meter; measuring, by a general metrology unit of the centralising meter, the electrical consumption of all the electrical installations that the remote basic meters are responsible for supervising; and, when the $\Delta Ea_D/\Delta Ea_G$ ratio of an energy consumption $\Delta Ea_D$ declared by all the remote basic meters during a time T to an energy consumption $\Delta Ea_G$ measured by the general metrology unit during the time T is below a predefined threshold and furthermore the load curves of a plurality of remote basic meters show a drop to zero of the energy consumption, identifying which remote basic meter is subject to an energy-consumption fraud, by extrapolating the load curves of said plurality of remote basic meters and comparing the total energy consumptions $\Delta Ea_E$ estimated from the extrapolated load curves with said energy consumption $\Delta Ea_G$. Thus it is possible to easily identify where the fraud is located among the remote basic meters, without having to increase their requirements for processing resources.

According to a particular embodiment, the estimated energy consumption $\Delta Ea_E$ includes a predetermined intrinsic consumption $\Delta E_C$ of the remote basic meters.

According to a particular embodiment, the centralising meter identifies the remote basic meter subject to the energy-consumption fraud as being the remote basic meter for which the estimated energy consumption $\Delta Ea_E$ is closest to the measured energy consumption $\Delta Ea_G$.

According to a particular embodiment, the centralising meter identifies the remote basic meter subject to the energy-consumption fraud as being the remote basic meter for which the following expression is minimum:

$$\left|1 - \frac{\Delta Ea_E}{\Delta Ea_G}\right|$$

According to a particular embodiment, the centralising meter identifies the remote basic meter subject to the energy-consumption fraud as being the remote basic meter for which the following ratio is maximum:

$$\frac{\Delta Ea_E}{\Delta Ea_G}$$

According to a particular embodiment, when the load curves of a plurality of remote basic meters show that the energy consumption has dropped to zero, the centralising meter performs the following steps: recovering information on the state of each remote basic meter the load curve of which shows that the energy consumption has dropped to zero, by sending a dedicated atomic command frame to said remote basic meter by the emulated application instanciated for said remote basic meter; and excluding from the extrapolations the load curve of each remote basic meter the recovered state information of which indicates that a breaker member of said remote basic meter is open and/or a downstream breaker of the electrical installation that said remote basic meter is responsible for supervising is open.

According to a particular embodiment, the centralising meter, in performing each extrapolation, considers the load curve in question over a period equal to T/2 until the moment when the energy consumption drops to zero, where T represents a period between two successive metering index readings by the general metrology unit for determining the energy consumption $\Delta Ea_G$.

The invention also relates to a computer program that can be stored on a medium and/or downloaded from a communication network, in order to be read by a processor. This computer program comprises instructions for implementing the method mentioned above, when said program is executed by the processor. The invention also relates to a storage medium comprising such a computer program.

The invention also relates to a device, called a centralising meter, intended to be included in an automated metering management system in the context of an electrical distribution service, the centralising meter comprising a first powerline communication unit configured for communicating with a data concentrator via a first powerline communication network in a first frequency band, and a second powerline communication unit configured for communicating with a plurality of devices, called remote basic meters, via a second powerline communication network in a second frequency band distinct from the first frequency band. The centralising meter further comprises: a control unit configured for emulating a smart electricity meter application with respect to the data concentrator for each remote basic meter registered with the centralising meter via the second powerline communication network, each emulated application constructing a load curve for the corresponding remote basic meter; and a general metrology unit responsible for reading the electrical consumption of all the electrical installations that the remote basic meters are responsible for supervising. In addition, the control unit comprises a metrology control module which, when the ratio $\Delta Ea_D/\Delta Ea_G$ of an energy consumption $\Delta Ea_D$ declared by all the remote basic meters during a time T to an energy consumption $\Delta Ea_G$ measured by the general metrology unit during the time T is below a predefined threshold and when furthermore the load curves of a plurality of remote basic meters show that the energy consumption has dropped to zero, is configured for identifying which remote basic meter is subject to an energy-consumption fraud, by extrapolating the load curves of said plurality of remote basic meters and comparing total consumptions $\Delta Ea_E$ estimated from the load curves extrapolated with said energy consumption $\Delta Ea_G$.

BRIEF DESCRIPTION OF THE DRAWINGS

The features of the invention mentioned above, as well as others, will emerge more clearly from the reading of the following description of at least one example embodiment, said description being made in relation to the accompanying drawings, among which.

DETAILED DISCLOSURE OF EMBODIMENTS

Figure 1:
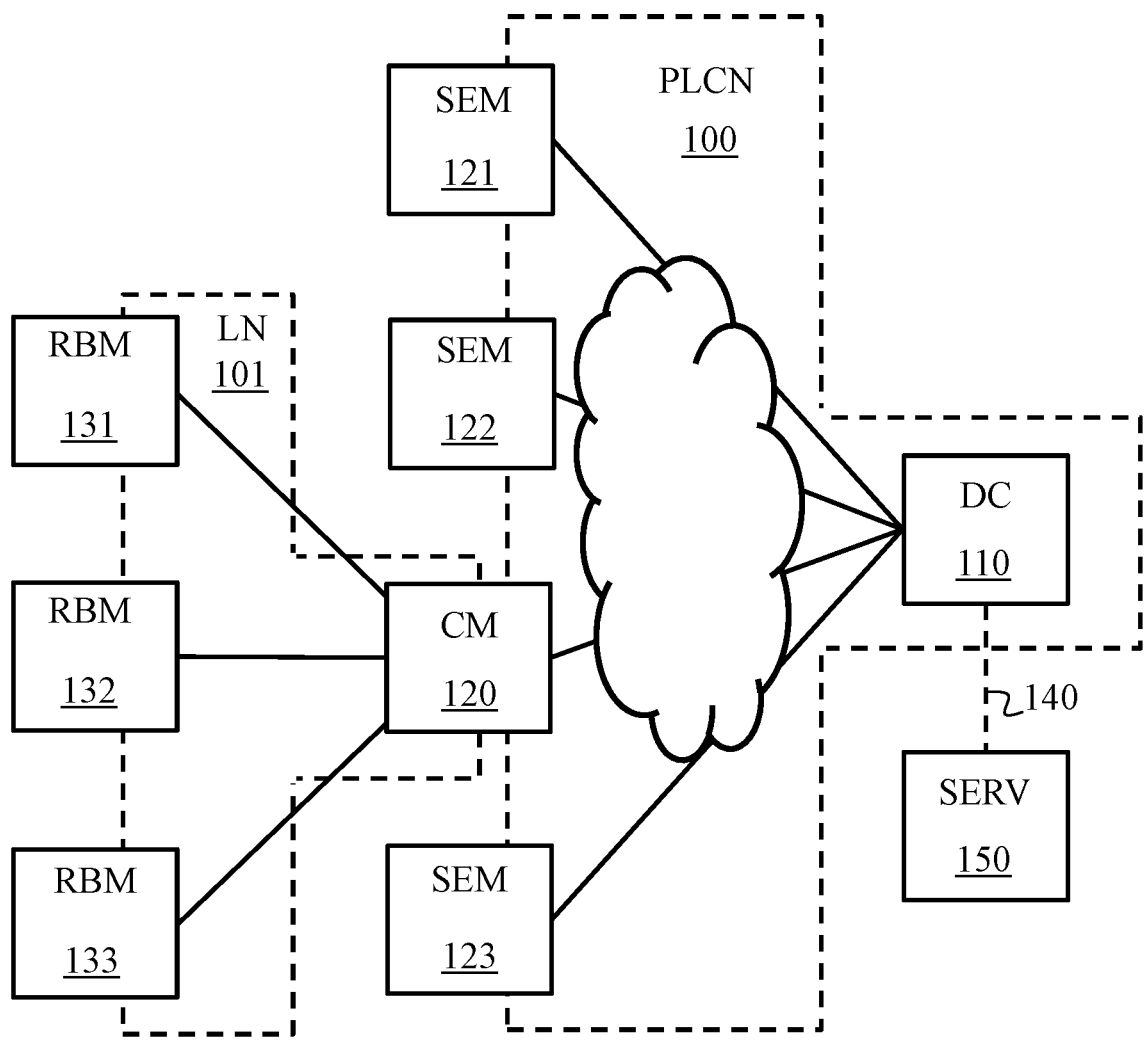
FIG. 1 illustrates schematically a communication system, supporting an automated metering management, wherein the present invention is implemented.

FIG. 1 thus illustrates schematically an example of a communication system, supporting an automated metering management AMM in the context of electrical distribution services, wherein the present invention is implemented.

The communication system comprises at least one powerline communication PLCN network 100, simply referred to as PLCN network 100 hereinafter, deployed logically on an electrical supply network. The PLCN network 100 enables an automated metering management system AMM to be established in the context of electrical distribution services.

The communication system comprises a particular node device, called a data concentrator DC. The PLCN network 100 is intended to make it possible to connect a plurality of node devices to the data concentrator DC 110. The node devices that the PLCN network 100 aims to connect to the data concentrator DC 110 are smart electricity meters SEM 121, 122, 123. The PLCN network 100 thus makes it possible to establish powerline communications so that the data concentrator DC 110 can in particular automatically perform operations of collecting electrical consumption metering readings, said metering being performed by the smart electricity meters with regard to electrical installations that said smart electricity meters are respectively responsible for supervising. The PLCN network 100 furthermore in particular enables the data concentrator DC 110 to perform applicative update operations at the smart electricity meters, and in general terms to remotely control said smart electricity meters. The powerline communications via the PLCN network 100 are preferentially in accordance with the G3-PLC protocol. In a variant, the powerline communications via the PLCN network 100 are preferentially in accordance with the PRIME (PoweRline Intelligent Metering Evolution) specifications as defined in the ITU normative document G.9904.

The communication system further comprises an entity for managing the automated metering management system AMM that is in particular responsible for processing the metering readings in a centralised manner. The management entity of the automated metering management system AMM takes the form of a server SERV 150, or a set of servers, to which the data concentrator DC 110 is connected via a communication link 140. The communication link 140 is a wireless communication link, for example of the GPRS (General Packet Radio Service), UMTS (Universal Mobile Telecommunication System) or LTE (Long-Term Evolution) type. The communication link 140 may in a variant be a cable communication link.

The data concentrator DC 110 performs the operations of collecting metering readings on behalf of the server SERV 150. In other words, the data concentrator DC 110 collects the metering readings from the smart electricity meters that are attached thereto (i.e. the smart electricity meters of the PLCN network 100), and then supplies said readings to the server SERV 150 for processing. In addition, the data concentrator DC 110 preferentially performs the applicative update operations on behalf of the server SERV 150. The applicative update operations are performed by the data concentrator DC 110, data block by data block, at the smart electricity meters that are attached thereto. The data concentrator DC 110 manages any retransmission requirements within the PLCN network 100 to ensure that the operations of collecting metering readings and any applicative update operations take place correctly. In such an automated metering management system AMM, the server SERV 150 typically relies on a plurality of such data concentrators among which the remote operation of the smart electricity meters is distributed.

The PLCN network 100 comprises at least one centralising meter CM 120. The centralising meter CM 120 serves as a proxy device for a plurality of remote basic meters RBM 131, 132, 133. From the point of view of the PLCN network 100 and therefore the data concentrator DC 110, the remote basic meters RBM 131, 132, 133 are masked by the centralising meter CM 120, wherein there are centralised the applications that would have been necessary to the remote basic meters RBM 131, 132, 133 for communicating with the data concentrator DC 110 if said remote basic meters RBM 131, 132, 133 had been directly connected to the PLCN network 100. The remote basic meters RBM 131, 132, 133 are thus much less complex, and therefore less expensive in terms of hardware and energy resources, than the smart electricity meters SEM 121, 122, 123 that are adapted for communicating with the data concentrator DC 110 directly via the PLCN network 100.

The centralising meter CM 120 is thus intended to equip a property complex, such as a building or a residential district, wherein each room or dwelling is equipped with a remote basic meter RBM. This forms a metering system dedicated to the property complex.

As detailed below, the centralising meter CM 120 instanciates an application emulated for each remote basic meter RBM that is attached thereto, each emulated application thus instanciated being in communication with the data concentrator DC 110 as if the smart electricity meters thus emulated were located in the centralising meter CM 120. In other words, the centralising meter CM 120 emulates, with respect to the data concentrator DC 110, a smart electricity meter behaviour for each remote basic meter RBM that is attached thereto. As detailed hereinafter, each remote basic meter RBM performs the electrical consumption metering for the dwelling or room concerned, and informs the centralising meter CM to which said remote basic meter RBM is attached, by means of a protocol that is simplified compared with the protocol for communication with the data concentrator DC 110. It is then for the centralising meter CM in question to manage the complexity and the variety of the exchanges with the data concentrator DC 110, which are typically governed by the DLMS/COSEM format (Device Language Message Specification/Companion Specification for Energy Metering), as described in the IEC normative document 62056-5-3 and in the $12^{th}$ edition of the document "Bluebook: COSEM Interface Classes and OBIS Object Identification System" published by the DLMS User Association, preferentially used for performing the operations of metering reading and applicative update. A smart electricity meter typically has more than 500 COSEM objects including the load curves, the calendars, the tariffs, the indices, and all the interfaces (breaker members, modem, optical flag, etc.). The DLMS protocol makes it possible to make calls of the SET and GET type, as well as other specific actions on these objects. It is possible to configure parameters of smart electricity meters via calls of the SET type (modem parameters, applicative parameters such as tariffs, etc.), to read load curves (typically the curves allowing a reading every 15 minutes) via calls of the GET type, and to open or close their breaker members via specific actions. The application of a smart electricity meter generates and stores the COSEM objects and updates them regularly, reads them in order to transfer them to the data concentrator DEC 110 or acts on them where necessary according to the protocol exchanges with the data concentrator DC 110.

The communications between each remote basic meter RBM 131, 132, 133 and the centralising meter CM 120 are also powerline communications. This forms another powerline communication network LN 101 distinct from the PLCN network 100. The remote basic meters RBM 131, 132, 133 are connected, logically, directly to the centralising meter CM 120. The network LN 101 thus has a star topology, whereas the PLCN network 100 has a mesh topology, as in the context of the G3-PLC protocol, or a spanning tree topology as in the context of the PRIME specifications.

So as to ensure that the remote basic meters RBM 131, 132, 133 are masked from the data concentrator DC 110, distinct frequency bands are used. The powerline communications on the PLCN network 100 therefore use a first frequency band and the communications between the remote basic meters RBM 131, 132, 133 and the centralising meter CM 120 use a second frequency band distinct from the first frequency band (i.e. that does not overlap with the first frequency band). For example, the G3-PLC protocol and the PRIME specifications define various distinct frequency bands that can be used, in particular: a first frequency band CENELEC-A, which goes approximately from 35 kHz to 91 kHz; a second frequency band FCC, which goes approximately from 150 kHz to 480 kHz; a third frequency band CENELEC-B, which goes approximately from 98 kHz to 122 kHz. In a preferential embodiment, the centralising meter CM 120 uses the CENELEC-A frequency band for communicating with the data concentrator DC 110 and the FCC frequency band for communicating with each remote basic meter RBM 131, 132, 133 managed by said centralising meter CM 120.

Figure 2:
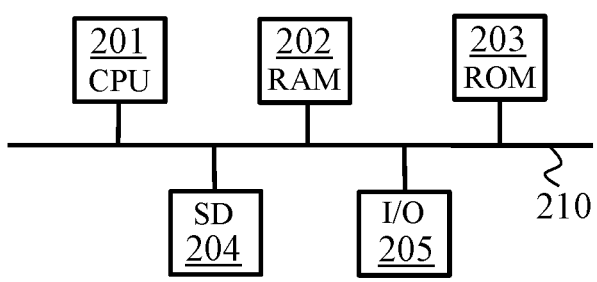
FIG. 2 illustrates schematically an example of hardware arrangement of a control unit used in the communication system.

FIG. 2 illustrates schematically an example of hardware arrangement of a control unit used in the communication system of the communication system of FIG. 1. Such a control unit is found in each remote basic meter RBM 131, 132, 133 and in the centralising meter CM 120, as detailed below in relation to FIGS. 3A and 3B.

The example of hardware architecture presented comprises, connected by a communication bus 210: a processor CPU 201; a random access memory RAM 202, a read only memory ROM 203 or a flash memory; a storage unit or a storage medium reader, such as an SD (Secure Digital) card reader 204; and a set of input/output interfaces I/O 205. The set of communication interfaces COM 305 enables the control unit to interact with other components within the same device, as detailed below in relation to FIGS. 3A and 3B.

The processor CPU 201 is capable of executing instructions loaded in the RAM memory 202 from the ROM memory 203, from an external memory (such as an SD card), from a storage medium or from a communication network. On powering up, the processor CPU 201 is capable of reading instructions from the RAM memory 202 and executing them. These instructions form a computer program causing the implementation, by the processor CPU 201, of all or part of the methods and steps described here.

Figure 3A:
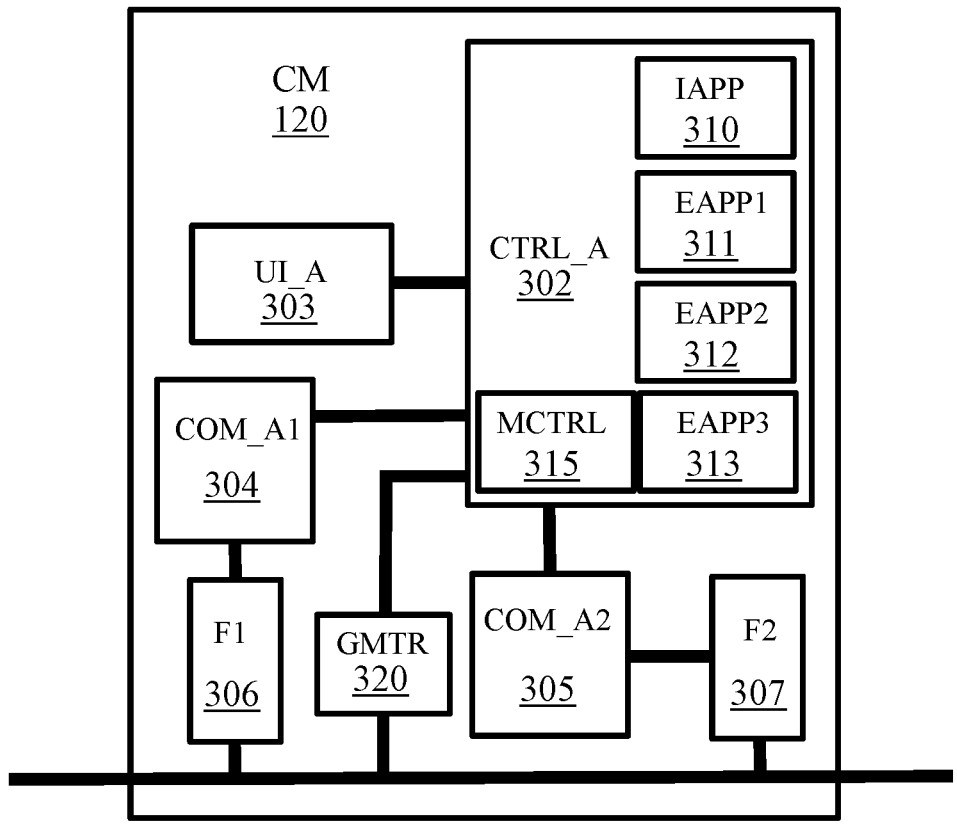
FIG. 3A illustrates schematically a centralising meter arrangement of the communication system.

Thus all or part of the methods and steps described here can be implemented in software form by executing a set of instructions by a programmable machine, such as a DSP (digital signal processor) or a microcontroller or a processor. All or part of the methods and steps described here can also be implemented in hardware form by a machine or a dedicated component, such as an FPGA (field-programmable gate array) or an ASIC (application-specific integrated circuit). Thus the control unit comprises electronic circuitry adapted and configured for implementing the methods and steps described here FIG. 3A illustrates schematically an arrangement of the centralising meter CM 120, in a particular embodiment.

The centralising meter CM 120 comprises a control unit CTRL_A 302. The control unit CTRL_A 302 is responsible for supervising the operation of the centralising meter CM 120.

The centralising meter CM 120 further comprises a first communication unit COM_A1 304 intended to make it possible to communicate by powerline with the data concentrator DC 110 (i.e. via the PLCN network 100). The first communication unit COM_A1 304 therefore acts in the first frequency band.

The centralising meter CM 120 further comprises a second communication unit COM_A2 305 intended to make it possible to communicate by powerline with each remote basic meter RBM attached to the centralising meter CM 120. The second communication unit COM_A2 305 therefore acts in the second frequency band.

In a particular embodiment, the first communication unit COM_A1 304 is provided with a first filter F1 306 adapted and configured for eliminating the signals of the frequency band of the powerline communications with the second communication unit COM_A2 305. Thus the communications with the PLCN network 100 suffer less interference from the communications with the remote basic meters RBM 131, 132, 133 attached to the centralising meter CM 120.

In a particular embodiment, the second communication unit COM_A2 305 is provided with a second filter F2 307 adapted and configured for eliminating the signals of the frequency band of the powerline communications with the first communication unit COM_A1 307. Thus the communications with the remote basic meters RBM 131, 132, 133 attached to the centralising meter CM 120 suffer less interference from the communications within the PLCN network 100.

It should be noted that, in the case of a three-phase electrical supply distribution, it is possible to inject the three-phase communication signals at the second communication unit COM_A2 and single-phase or three-phase at the first communication unit COM_A1.

The centralising meter CM 120 further comprises a general metrology unit GMTR 320 responsible for reading the electrical consumption of all the electrical installations that the remote basic meters RBM 131, 132, 133 attached to the centralising meter CM 120 are responsible for supervising. This is possible because the electrical supply distribution of these electrical installations passes through the centralising meter CM 120. The control unit CTRL_A 302 thus obtains, from the general metrology unit GMTR 320, among others, metering index readings.

The control unit CTRL_A 302 implements an internal application IAPP 310. The internal application IAPP 310 is in particular responsible for instanciating an emulated application EAPP for each remote basic meter RBM attached to the centralising meter CM 120. Thus the control unit CTRL_A 302 therefore comprises an instance of an emulated application EAPP for each remote basic meter RBM attached to the centralising meter CM 120. By way of illustration, as three remote basic meters RBM 131, 132, 133 are attached to the centralising meter CM 120 in FIG. 1, FIG. 3A shows three respective emulated applications EAPP 311, 312, 313.

The control unit CTRL_A 302 further implements a metrology control module MCTRL 315 responsible for making comparisons between the electrical energy consumption recorded by the general metrology unit GMTR 320 and the electrical energy consumptions declared by the remote basic meters RBM 131, 132, 133 attached to the centralising meter CM 120. More particularly, the metrology control module MCTRL 315 uses the metering index readings made by the general metrology unit GMTR 320 and those declared by said remote basic meters RBM 131, 132, 133 in order to detect any situations of energy-consumption fraud. This aspect is detailed below in relation to FIGS. 6 to 8.

The centralising meter CM 120 may further comprise a user interface unit UI_A 303 adapted for interacting with users. In a particular embodiment, the user interface unit UI_A 303 comprises a display for in particularly displaying metering index readings corresponding to the remote basic meters RBM 131, 132, 133 attached to the centralising meter CM 120. The user interface unit UI_A 303 comprises a control panel adapted for enabling the users to enter a password. Each remote basic meter RBM 131, 132, 133 attached to the centralising meter CM 120 has its own password. The control unit CTRL_A 302 is responsible for checking that the password entered for a remote basic meter RBM 131, 132, 133 corresponds to a password expected for said remote basic meter RBM 131, 132, 133, and, if such is the case, the control unit CTRL_A 302 recovers the metering index reading from the instance of the emulated application EAPP corresponding to said remote basic meter RBM 131, 132, 133 and instructs the user interface unit UI_A 303 to display, on the display, the recovered metering index reading. A default password is defined deterministically for each remote basic meter RBM 131, 132, 133. The password of each remote basic meter RBM 131, 132, 133 can be changed at the centralising meter CM 120 by means of the user interface unit UI_A 303, the password thus changed then being stored by the centralising meter CM 120 in association with the instance of the corresponding emulated application EAPP.

Unlike the remote basic meters RBM, the centralising meter CM 120 preferentially does not comprise any breaker member. This is because the role of the centralising meter CM 120 is not to perform operations of protecting the electrical installations, but to centralise the applicative intelligence, and therefore the relevant hardware resources, on behalf of the remote basic meters RBM.

Figure 3B:
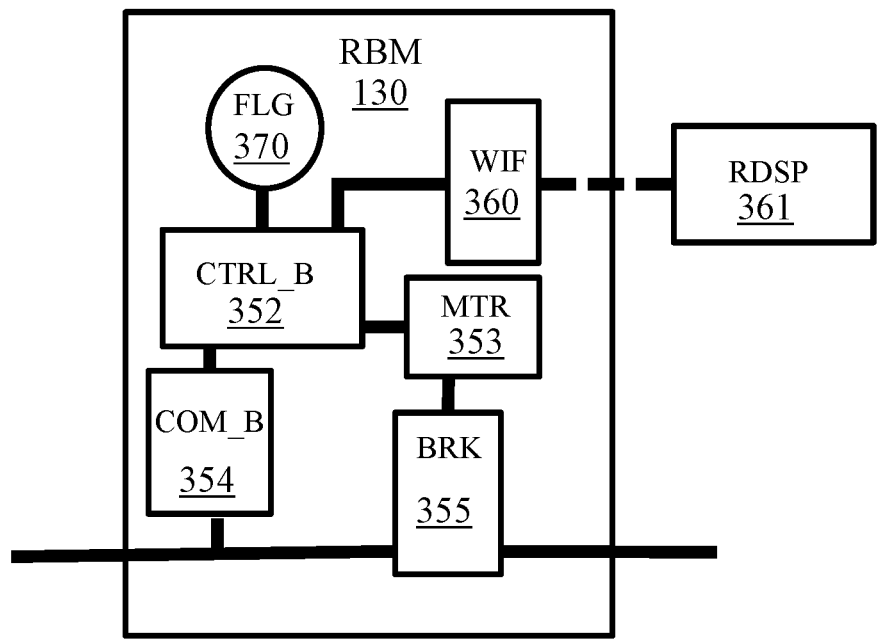
FIG. 3B illustrates schematically a remote basic meter arrangement of the communication system.

FIG. 3B illustrates schematically a remote basic meter arrangement RBM 130. The remote basic meters RBM 131, 132, 133 are arranged in accordance with this remote basic meter RBM 130, in a particular embodiment.

The remote basic meter RBM 130 comprises a control unit CTRL_B 352. The control unit CTRL_B 352 is responsible for supervising the operation of the remote basic meter RBM 130.

The remote basic meter RBM 130 further comprises a metrology unit MTR 353 responsible for reading the electrical consumption of the electrical installation that the remote basic meter RBM 130 is responsible for supervising. The control unit CTRL_B 352 thus obtains from the metrology unit MTR 353, among other things, metering index readings.

The remote basic meter RBM 130 further comprises a breaker member BRK 355. The breaker member BRK 355 is a circuit breaker that can be controlled remotely by the operator and makes it possible to activate and deactivate as required the electrical supply of the electrical installation supervised by the remote basic meter RBM 130.

The remote basic meter RBM 130 further comprises a communication unit COM_B 354 intended to make it possible to communicate by powerline with the centralising meter CM to which said remote basic meter RBM 130 is attached. The communication unit COM_B 354 acts in the second frequency band.

The remote basic meter RBM 130 preferentially further comprises an optical communication interface FLG 370 enabling a human operator to connect a probe conforming to IEC 62056-21, also known by the term flag probe. Such a probe is connected to a terminal made available to the human operator, and makes it possible to perform a metering index reading from the remote basic meter RBM 130 and optionally to modify the configuration of the remote basic meter RBM 130. The remote basic meter RBM 130 then comprises a metal washer surrounding a first optical transceiver, and the probe comprises a magnetised washer surrounding a second optical transceiver. The arrangement is such that, when the human operator uses the probe, the magnetised washer is placed against the metal washer, so that the first and second optical transceivers are facing each other. This arrangement facilitates the fitting of the probe on the remote basic meter RBM 130. The remote basic meter RBM 130 may comprise, in the control unit CTRL_B 352, a memory area adapted for storing metering index readings supplied at regular intervals of predefined duration (e.g. every 5 minutes) by the metrology unit MTR 353 over a predefined time range (e.g. for the last 2 days). The human operator can then, by means of the optical communication interface FLG 370, recover the metering index readings thus stored.

Unlike the centralising meter CM 120, the remote basic meter RBM 130 does not comprise any user interface (optionally a few operating-state light emitting diodes) and in particular no display. However, the remote basic meter RBM 130 preferentially further comprises a wireless communication interface WIF 360 adapted and configured for transmitting information to be displayed on a remote display RDSP 361. Such a remote display RDSP 361 is typically installed in the dwelling or room the electrical installation of which is supervised by the remote basic meter RBM 130 in question. The wireless communication interface WIF 360 is for example of the Wi-Fi, Zigbee or KNX-RF (i.e. KNX on radio-frequency physical layer) type as defined in ISO/IEC 14543. The information to be displayed on the remote display is indicated to the remote basic meter RBM 130 by the centralising meter CM 120 by means of a specific command, as described below.

It should be noted that, in a particular embodiment, a filter of the same type as the filter F2 307 can be interposed between the communication unit COM_B 354 and the electrical supply line.

Figure 4:
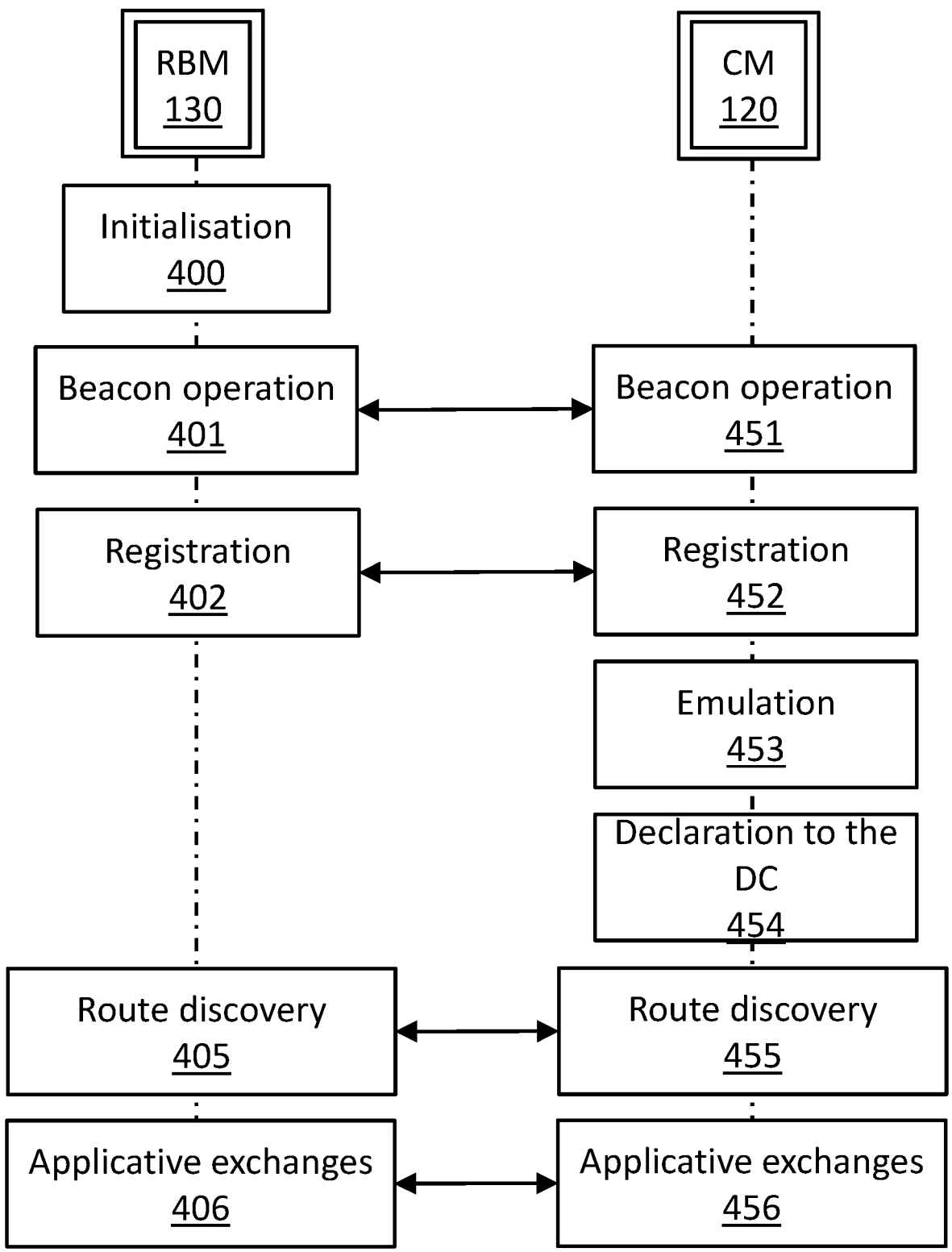
FIG. 4 illustrates schematically exchanges between a remote basic meter and a centralising meter in the communication system.

FIG. 4 illustrates schematically exchanges between a said remote basic meter RBM 130 and the centralising meter CM 120 to which said remote basic meter RBM 130 must be attached.

In a step 400, the remote basic meter RBM 130 is initialised, for example following installation by an approved installer.

In a step 401, the remote basic meter RBM 130 performs a beacon operation in cooperation with the centralising meter CM 120 (step 451). The beacon operation consists, for the remote basic meter RBM 130, in detecting the presence of the centralising meter CM to which to attach.

In an example embodiment modelled on the behaviour of the 6LoWPAN protocol (IPv6 Low power Wireless Personal Area Networks, as specified in the normative documents RFC 4919 and 4944) used in the context of the G3-PLC protocol, the beacon operation comprises the broadcasting of a beacon request by the remote basic meter RBM 130. Each device connected to the electrical distribution network capturing the broadcast beacon request is supposed to respond thereto in unicast mode. The centralising meter CM 120 responds thereto. This is because the electrical distribution network is such that the electrical cable distance between the remote basic meter RBM 130 and the centralising meter CM 120 to which said remote basic meter RBM 130 is supposed to attach is less than the range of the powerline communications specified for the remote basic meters RBM.

Other remote basic meters RBM may capture the broadcast beacon request. In one embodiment, the remote basic meters RBM are configured to respond to the beacon requests. In their response, the remote basic meters RBM provide information representing the number of hops that separate them from the coordinator of their network, namely the centralising meter CM to which they are attached. This can therefore be done indirectly by means of route cost information, since the routing is configured so that just one number of hops corresponds to a given route cost. For example, a route cost <7 corresponds to 0 hops, from 7 to 13 corresponds to one hop, from 14 to 26 to 2 hops, etc. The remote basic meters RBM able to respond have therefore been registered, and the number of hops that separate them from their centralising meter CM is thus equal to 1 (direct logic connection). The remote basic meters RBM are then configured for rejecting any response that indicates a non-zero number of hops for reaching the network coordinator, namely the centralising meter CM to which they are supposed to attach. In one preferential embodiment, the remote basic meters RBM are configured not to respond to the beacon request, and therefore only the centralising meter CM 120 responds to the beacon requests sent by the remote basic meters RBM that are able to be attached to it.

In a step 402, the remote basic meter RBM 130 performs a registration operation in cooperation with the centralising meter CM 120 (step 452). The registration operation consists in confirming, with the centralising meter CM 120, that said remote basic meter RBM 130 has identified the centralising meter CM 120 as being its attachment point and confirming that the centralising meter CM 120 has taken into account the appearance of said remote basic meter RBM 130. During the registration operation, the centralising meter CM 120 and said remote basic meter RBM 130 authenticate each other mutually. Preferentially, during the registration operation, the centralising meter CM 120 transmits, to said remote basic meter RBM 130, communication securement information intended to secure the subsequent exchanges between the centralising meter CM 120 and said remote basic meter RBM 130.

In an example embodiment modelled on the behaviour of the EAP-PSK protocol (Extensible Authentication Protocol with Pre-Shared Key, as defined in the normative document RFC 4764) used in the context of the G3-PLC protocol, the remote basic meter RBM 130 transmits to the centralising meter CM 120 a join request, which gives rise to a first challenge request on the part of the centralising meter CM 120 intended for said remote basic meter RBM 130. This first challenge request includes a first random number, as well as an identifier that identifies the centralising meter CM 120. Said remote basic meter RBM 130 in return transmits a first challenge response that includes a second random number, as well as an identifier of said remote basic meter RBM 130 and a first calculation result. The first calculation result results from a predefined function execution taking as an input the first random number, the second random number and a secret key PSK (Pre-Shared Key) known to said remote basic meter RBM 130 and to the centralising meter CM 120. Checking the calculation result by the centralising meter CM 120 makes it possible to authenticate said remote basic meter 130. Next, the centralising meter CM 120 transmits to said remote basic meter RBM 130 a second identification request, which includes a second calculation result. The second calculation result results from a predefined function execution taking as an input the second random number and the secret key PSK. Checking the second calculation result by said remote basic meter RBM 130 makes it possible to authenticate the centralising meter CM 120. The second challenge request preferentially contains, in encrypted form, an encryption key GMK_CC that is used subsequently to encrypt the exchanges between said remote basic meter RBM 130 and the centralising meter CM 120.

As a result of the registration by the centralising meter CM 120 of said remote basic meter RBM 130 in the step 452, the centralising meter CM 120 instanciates an emulated application EAPP for said remote basic meter RBM 130 in a step 453. Then, in a step 454, the centralising meter CM 120, by means of said emulated application EAPP, declares said remote basic meter RBM 130 to the data concentrator DC 110. One embodiment is detailed below in relation to FIG. 5. The data concentrator DC 110 thus sees said remote basic meter RBM 130 as if said remote basic meter RBM 130 were a smart electricity meter, with complete functionalities, directly implemented by the centralising meter CM 120.

In a step 455 (which may take place in parallel to the step 453 and/or to the step 454), the centralising meter CM 120 performs a route discovery operation in collaboration with said remote basic meter RBM 130 (step 405). The route discovery operation consists in updating respective routing tables of the centralising meter CM 120 and of said remote basic meter RBM 130 to finalise putting them in communication.

In an example embodiment modelled on the behaviour of the LOADng protocol ("Lightweight On-demand Ad-hoc Distance-vector routing protocol—next generation") used in the context of the G3-PLC protocol, the centralising meter CM 120 broadcasts a route request. The route request targets said remote basic meter RBM 130 and requests discovering which path to use for communicating with said remote basic meter RBM 130. Said remote basic meter RBM 130 in return transmits, in unicast mode, a route reply. The centralising meter CM 120 and said remote basic meter RBM 130 then update their respective routing tables by indicating that said centralising meter CM 120 and said remote basic meter RBM 130 are in direct connection (i.e. a single hop). This approach simplifies the deployment of the remote basic meters RBM 130 by re-using the routing mechanisms commonly used in the context of the automated metering management systems AMM.

Next, in a step 456, the centralising meter CM 120 is able to establish applicative exchanges, preferably secured, with said remote basic meter RBM 130 (step 406). As already mentioned, these applicative exchanges are preferentially encrypted by means of the encryption key GMK_CC.

By means of these applicative exchanges, the centralising meter CM 120 is able to transmit atomic command frames to said remote basic meter RBM 130 and to receive in return response frames from said remote basic meter RBM 130.

This makes it possible for the centralising meter CM 120 and the remote basic meters RBM that are attached thereto to have to interact only for processing atomic metrology commands and circuit-breaker management commands, whereas the applicative requests coming from the data concentrator DC 110 require substantially more complex processing operations, such as analytic, shaping and encapsulation processing operations. The atomic commands relate to time setting of said remote basic meter RBM 130, instructions to open the breaker member BRK 355, instructions to close the breaker member BRK 355, instructions to send a metering index reading, and requests for reports on the state of said remote basic meter RBM 130.

When said remote basic meter RBM 130 comprises the wireless communication interface WIF 360 in order to allow the use of the remote display RDSP 361, the centralising meter CM 120 is able to order a display, on said remote display RDSP 361, of a string of characters supplied as an argument.

Each atomic command frame comprises for example a command byte, optionally followed by payload data of predetermined size according to the command in question.

For example, the command byte takes the following values, the other values being reserved for future uses:

0x01: Time-setting command, followed by 6 payload bytes for indicating the current year, month, day, hour, minute and second;

0x02: Command for opening the breaker member BRK 355;

0x03: Command for closing the breaker member BRK 355;

0x04: Command for sending a metering index reading;

0x05: Command to send the state of said remote basic meter RBM 130; and

0x06: Command to display on the remote display, followed by 1 byte indicating the size M of a string of characters to be displayed, as well as M bytes containing the string of characters to be displayed.

On reception of such an atomic command frame, the remote basic meter RBM 130 implements the command in question; the response frame indicates whether taking the command into account has been a success or a failure. Each response frame comprises for example a response byte, optionally followed by payload data of predefined size according to the command that gave rise to the response in question. For example, the response byte takes the following values, the other values being reserved for future uses:

0x01: Simple acknowledgement;

0x02: Supply of metering index reading, followed by 4 metering index bytes and 6 corresponding timestamp bytes; and 0x03: Supply of state, followed by one status byte.

For example, the status byte takes the following values:

0x00: OK

0x01: Suspected magnetic fraud;

0x02: Bypass fraud suspected;

0x03: Metrological anomaly detected;

0x04: Abnormal heating detected; and

0x05: Other fault detected.

Two bits can be reserved in the status byte for indicating the states of the operator circuit breaker BRK 355 and of a downstream breaker DBRK placed at the input of the electrical insulation that the remote basic meter RBM in question is responsible for supervising:

1 bit: Breaker member BRK 355 open (0)/closed (1); and 1 bit: Downstream breaker DBRK open (0)/closed (1).

The remote basic meter RBM is capable of determining whether the downstream breaker DBRK is open or closed by means of a measurement of voltage at the input of the electrical installation that the remote basic meter RBM in question is responsible for supervising. This voltage measurement can be made by the metrology unit MTR 353.

Figure 5:
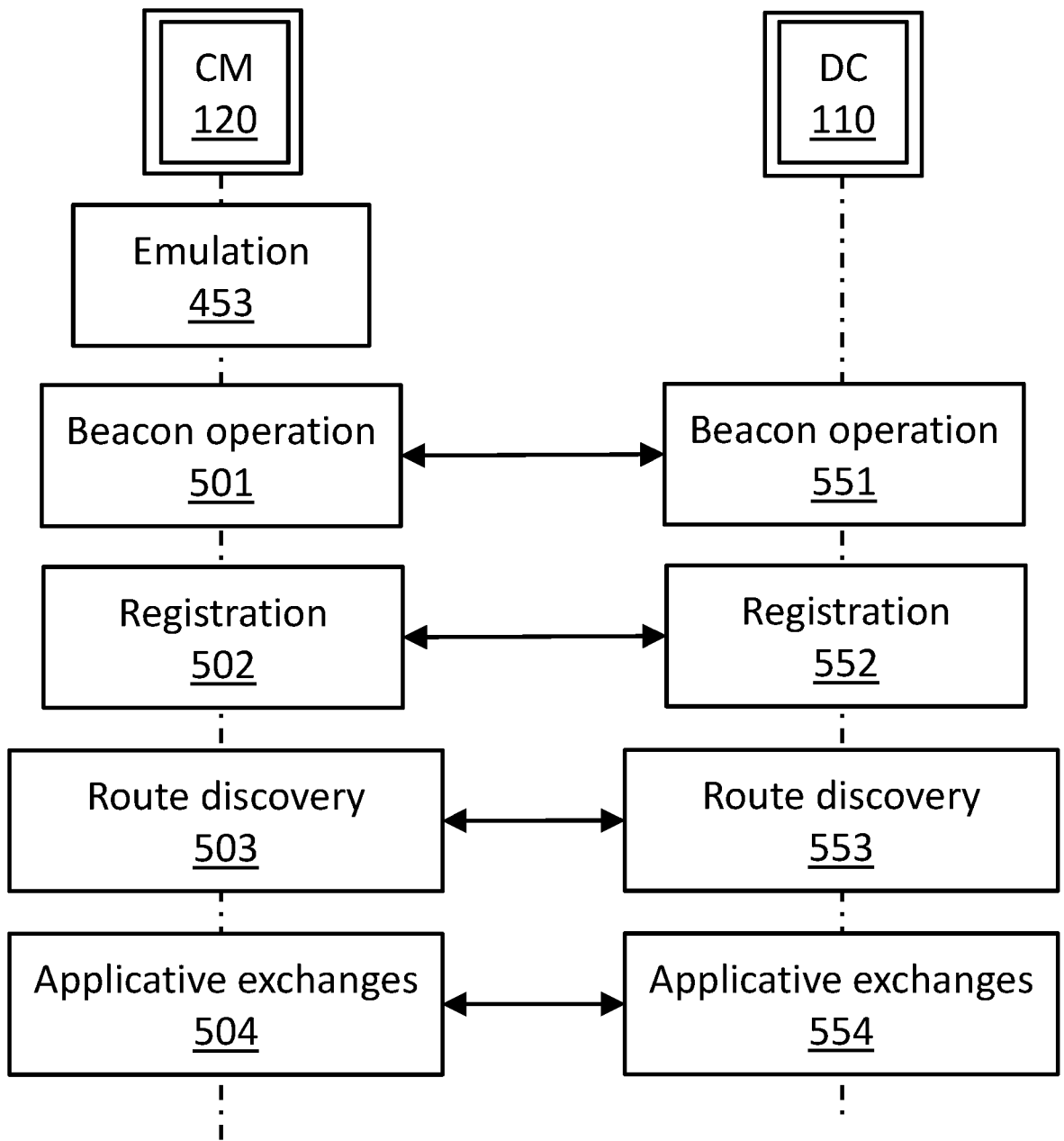
FIG. 5 illustrates schematically exchanges between a centralising meter and a data concentrator in the communication system.

FIG. 5 illustrates schematically exchanges between the centralising meter CM 120 and the data concentrator DC 110 via the PLCN network 100.

Following the instantiation by the centralising meter CM 120 of an emulated application EAPP for a said remote basic meter RBM 130 in the step 453, the centralising meter CM 120, by means of said emulated application EAPP, declares said remote basic meter RBM 130 to the data concentrator DC 110. Thus, in a step 501, the centralising meter CM 120 performs a beacon operation in cooperation with the data concentrator DC 110 (step 551). The beacon operation consists in identifying, for the emulated application EAPP in question, how to attach to the PLCN network 110 in order to be declared to the data concentrator DC 110. As with the algorithm in FIG. 4, the 6LoWPAN protocol can be used here. One difference however lies in the fact that, in the PLCN network 100, one or more smart electricity meters SEM can serve as relays for reaching the data concentrator DC 110.

In a step 502, said emulated application EAPP performs a registration operation in cooperation with the data concentrator DC 110 (step 552). The registration operation consists in confirming with the data concentrator DC 110 that said emulated application EAPP has identified a point of attachment to the PLCN network 100 and confirming that the data concentrator DC 110 has taken into account the appearance of the smart electricity meter emulated by said emulated application EAPP. During the registration operation, the data concentrator DC 110 and said emulated application EAPP authenticate each other mutually. As with the algorithm in FIG. 4, the EAP-PSK protocol can be used here.

In a step 553, the data concentrator DC 110 performs a route discovery operation in collaboration with said emulated application EAPP (step 503). The route discovery operation consists in updating respective routing tables of the data concentrator DC 110 and of said emulated application EAPP to finalise putting them in communication. As with the algorithm in FIG. 4, the LOADng protocol can be used here. It should be noted that, in this case, each emulated application EAPP instanciated in the centralising meter CM 120 has its own routing table with respect to the PLCN network 100.

Next, in a step 504, the data concentrator DC 110 is able to establish application exchanges, preferentially secured, with said emulated application (step 554).

Thus, by means of its control unit CTRL_A 302 and the emulated applications EAPP, the centralising meter CM 120 is able to respond to applicative requests of the data concentrator DC 110 with respect to the remote basic meters RBM 131, 132, 133 in the context of the electrical distribution service, by controlling the remote basic meters RBM 131, 132, 133 by means of a set of atomic metrology commands and circuit-breaker management commands. Most of the applicative processing operations that require most of the hardware processing resources usually required in smart electricity meters are thus shared in the centralising meter CM 120 for the remote basic meters RBM 131, 132, 133.

Figure 6:
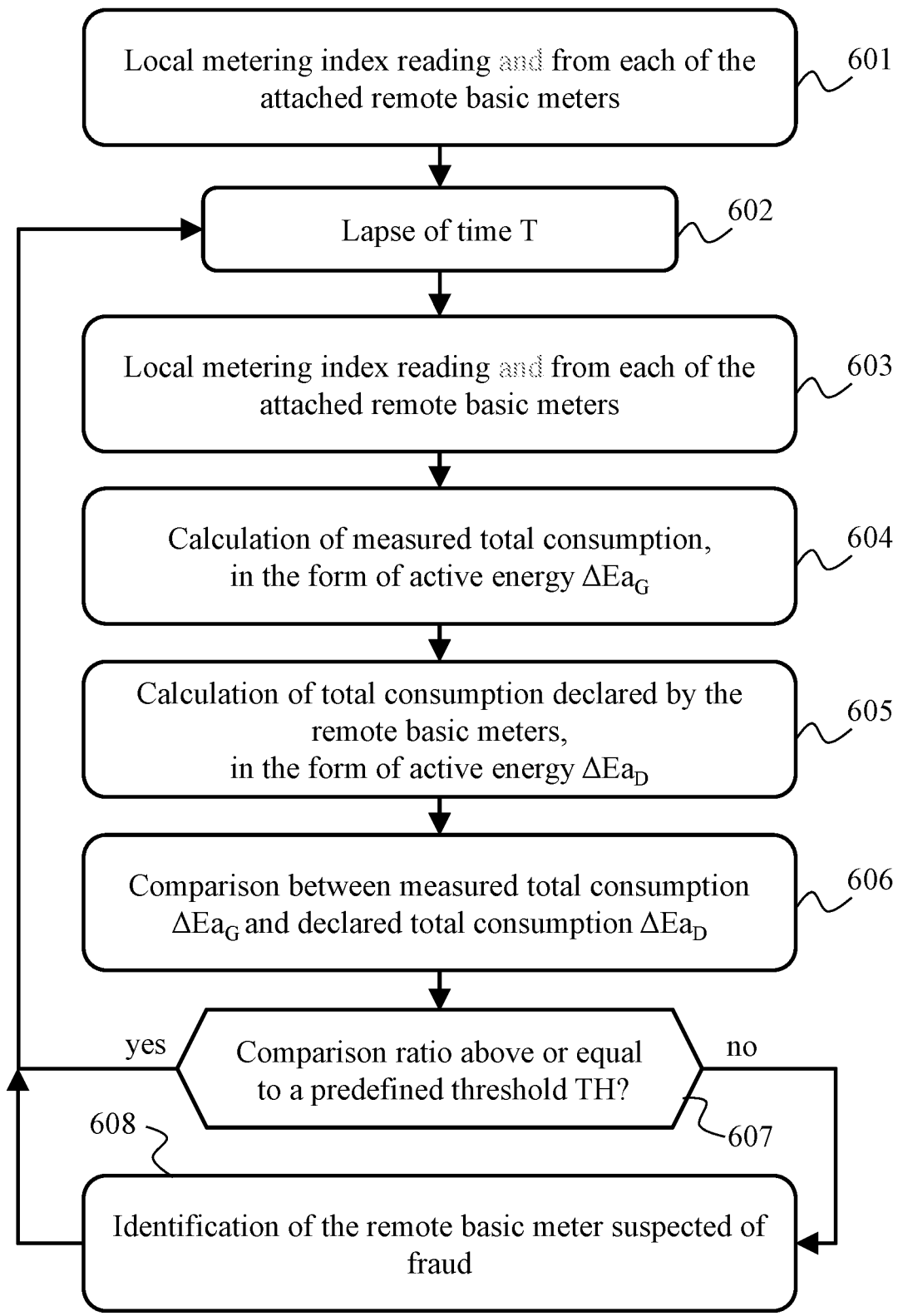
FIG. 6 illustrates schematically an algorithm, implemented in the centralising meter, for detecting fraud.

FIG. 6 illustrates schematically a fraud detection algorithm. The algorithm in FIG. 6 is implemented by the centralising meter CM 120 and more particularly by the metrology control module MCTRL 315 of the control unit CTRL_A 302.

In a step 601, the metrology control module MCTRL 315 obtains a local metering index reading, i.e. from the general metrology unit GMTR 320, as well as a metering index reading from each remote basic meter RBM that is attached to the centralising meter CM 120. Each metering index reading from a said remote basic meter RBM is obtained by sending an atomic command frame to said remote basic meter RBM by the emulated application EAPP instanciated for said remote basic meter RBM. In return, each remote basic meter RBM transmits a response frame that includes the metering index reading requested. The metering index readings can be obtained from the remote basic meters RBM 131, 132, 133 in the context of an establishment of load curves, as described below in relation to FIG. 7.

In a step 602, the metrology control module MCTRL 315 awaits the elapsing of a predefined time T that corresponds to a predefined time step of monitoring the accuracy of metering index readings made by the remote basic meters RBM 131, 132, 133 attached to the centralising meter CM 120. For example, the predefined time T is 60 minutes. Then, in a step 603, the metrology control module MCTRL 315 performs the same operations as in the step 601.

In a step 604, the metrology control module MCTRL 315 makes a calculation of measured total consumption, in the form of active energy $\Delta Ea_G$. The measured total consumption is calculated by means of the local metering index readings of the steps 601 and 603, and represents the difference in metering index between these two local metering index readings. During future iterations of the step 604, the same calculation is made by means of the local metering index readings of the consecutive iterations of the step 603.

In a step 605, the metrology control module MCTRL 315 makes a calculation of declared total consumption, in the form of active energy $\Delta Ea_D$. The calculation of declared total consumption is made by adding individual consumption calculations $\{(\Delta Ea_D)_K\}_{K=1, \ldots, N}$ (where N is the number of remote basic meters RBM 131, 132, 133 attached to the centralising meter CM 120) declared by each of the remote basic meters RBM 131, 132, 133 attached to the centralising meter CM 120. This therefore gives:

$$\Delta Ea_D = \sum_{K=1}^{N} (\Delta Ea_D)_K$$

Each calculation of declared individual consumption $(\Delta Ea_D)_K$ is made by means of the metering index readings obtained from the remote basic meter RBM in question in the steps 601 and 603, and represents the difference in metering index between these two metering index readings (new index-former index). During the next iterations of the step 604, the same calculations are made by means of the metering index readings obtained from the remote basic meter RBM in question in the consecutive iterations of the step 603.

In a step 606, the metrology control module MCTRL 315 makes a comparison between the declared total consumption $\Delta Ea_D$ and the measured total consumption $\Delta Ea_G$, and more particularly on the basis of the ratio $\Delta Ea_D/\Delta Ea_G$. In a particular embodiment, this comparison is made between firstly the sum of the declared total consumption $\Delta Ea_D$ and a predetermined intrinsic consumption $\Delta E_C$ of the remote basic meters RBM 131, 132, 133 attached to the concentrating meter CM 120, and secondly the measured total consumption $\Delta Ea_G$. This signifies that the ratio $\Delta E_C/\Delta Ea_G$ is considered in addition to the ratio $\Delta Ea_D/\Delta Ea_G$. The predetermined intrinsic consumption $\Delta E_C$ is typically equal to the product of the number N of remote basic meters RBM 131, 132, 133 attached to the centralising meter CM 120 multiplied by a known intrinsic consumption value $\Delta E_{RBM}$ of the remote basic meter model RBM. For example, the metrology control module MCTRL 315 compares the following ratio compared with a predefined threshold TH1, for example equal to 95%:

$(\Delta Ea_D+\Delta E_C)/\Delta Ea_G$

In another particular embodiment, the comparison is made directly between the declared total consumption $\Delta Ea_D$ and the measured total consumption $\Delta Ea_G$. For example, the metrology control module MCTRL 315 compares the ratio between the declared total consumption $\Delta Ea_D$ and the measured total consumption $\Delta Ea_G$ with respect to another predefined threshold TH2 that itself takes into account the predetermined intrinsic consumption $\Delta E_C$ of the remote basic meters RBM 131, 132, 133 attached to the concentrating meter CM 120.

In a step 607, the metrology control module MCTRL 315 checks whether the comparison ratio of the declared total consumption $\Delta Ea_D$ to the measured total consumption $\Delta Ea_G$ is above or equal to a predefined threshold TH. If such is the case, the step 602 is repeated; otherwise a step 608 is performed. By repeating the particular embodiments mentioned above, the metrology control module MCTRL 315 checks whether the ratio between firstly the sum of the declared total consumption $\Delta Ea_D$ and a predetermined intrinsic consumption $\Delta E_C$ of the remote basic meters RBM 131, 132, 133 attached to the concentrating meter CM 120, and secondly the measured total consumption $\Delta Ea_G$, is below the predefined threshold TH1, or whether the ratio between the declared total consumption $\Delta Ea_D$ and the measured total consumption $\Delta Ea_G$ is below the predefined threshold TH2.

In the step 608, the metrology control module MCTRL 315 considers that there has been an energy-consumption fraud on one of said remote basic meters RBM 131, 132, 133, and the metrology control module MCTRL 315 identifies the remote basic meter RBM that is suspected of fraud. The identification of the remote basic meter RBM suspected of fraud is detailed below in relation to FIG. 8.

Figure 7:
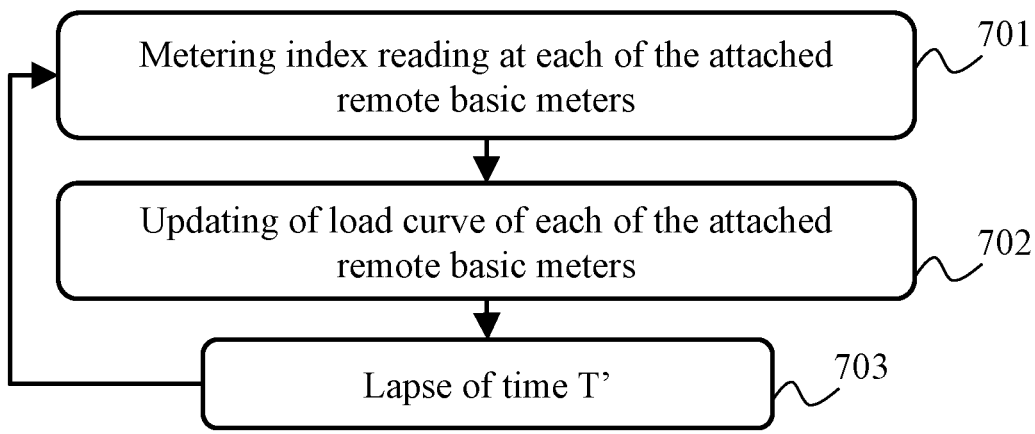
FIG. 7 illustrates schematically an algorithm, implemented in the centralising meter, for updating load curves.

FIG. 7 illustrates schematically an algorithm for updating a load curve of at least one remote basic meter RBM. The algorithm in FIG. 7 is implemented by the centralising meter CM 120 and more particularly by the emulated application EAPP of each remote basic meter RBM that is attached to the centralising meter CM 120.

The load curve defines the change in the energy consumption of the supervised electrical installation during a predefined period, and therefore in the energy and electrical power consumed during this predefined period. The load curve consists of a metering index reading at regular intervals in a predefined measuring time step, for example every 5 minutes.

Thus, in a step 701, each emulated application EAPP in question makes a metering index reading at the remote basic meter RBM for which said emulated application EAPP has been instanciated. This operation is performed by sending an atomic command frame requesting the sending of a metering index reading. In return, each remote basic meter RBM attached to the centralising meter CM 120 transmits a response frame that includes the metering index reading requested.

In a step 702, each emulated application EAPP in question updates the load curve associated with the remote basic meter RBM. As already mentioned, the load curve of each remote basic meter RBM attached to the centralising meter CM 120 is constructed and stored by the emulated application EAPP instanciated for said remote basic meter RBM. Each load curve thus gives, in a sampled manner, a representation of the change in the energy consumption that is declared by said remote basic meter RBM via the successive metering index readings thereof.

In a step 703, each emulated application EAPP in question awaits the elapsing of a time T' that corresponds to the time step between two successive metering index readings for one and the same remote basic meter RBM. Next, the step 701 is repeated.

It should be noted that the various emulated applications EAPP instanciated by the control unit CTRL_A 302 request the metering index readings from their respective remote basic meters RBM, in a manner that is remote in time. This limits the risks of collision of frame transmissions in the powerline communication network LN 101.

The load curves thus obtained are more particularly used, when an electrical-consumption fraud is detected, for identifying which remote basic meter RBM is supervising the electrical installation at the origin of said fraud, as detailed below in relation to FIG. 8.

Figure 8:
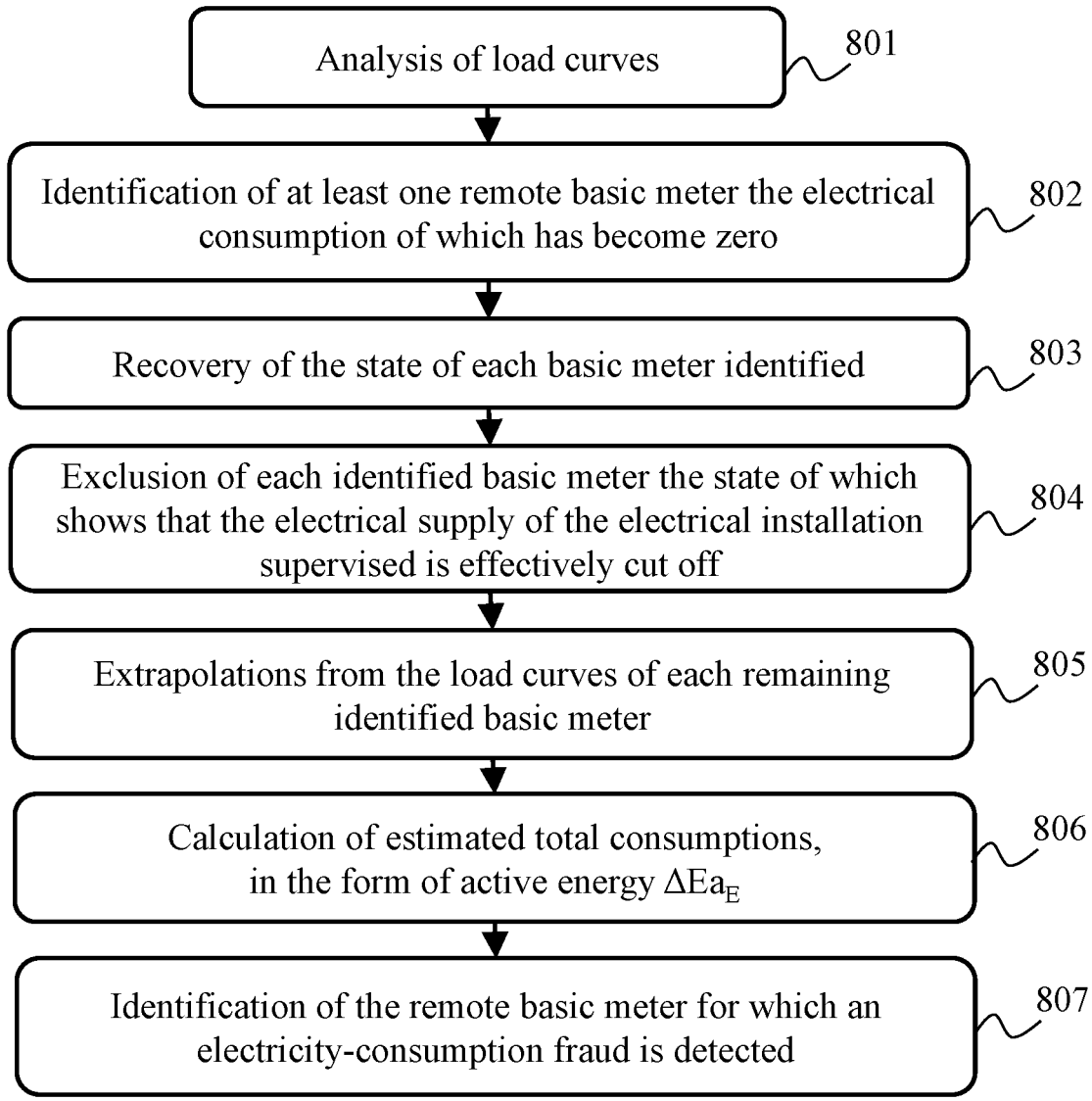
FIG. 8 illustrates schematically an algorithm for identifying a remote basic meter suspected of being at the origin of the detected fraud.

FIG. 8 illustrates schematically an algorithm for identifying a remote basic meter RBM suspected of being at the origin of the detected fraud. The algorithm in FIG. 8 is implemented by the centralising meter CM 120 and more particularly by the metrology control module MCTRL 315 of the control unit CTRL_A 302.

In a step 801, the metrology control module MCTRL 315 performs an analysis of the load curves of the remote basic meters RBM attached to the concentrating meter CM 120. The analysis comprises a phase of locating any drop to zero of the energy consumption of at least one of the remote basic meters RBM.

In a step 802, the metrology control module MCTRL 315 identifies at least one remote basic meter RBM attached to the centralising meter CM 120 for which the load curve concerned shows that the energy consumption has become zero (no change in the metering index). This drop to zero of the energy consumption declared by a said remote basic meter RBM did not necessarily occur during the time period T between the two metering index readings that made it possible to detect the fraud, but may have occurred in the previous time period T (but did not have sufficient total impact on the ratio of the declared total consumption $\Delta Ea_D$ to the measured total consumption $\Delta Ea_G$ to have been detected in the previous time period T). The metrology control module MCTRL 315 thus preferentially analyses the load curves over the time period T between the two metering index readings that made it possible to detect the fraud and over the preceding time period T. If a single remote basic meter RBM is clear from the step 802, the metrology control module MCTRL 315 has identified the remote basic meter RBM subject to the energy-consumption fraud, and the algorithm (not shown in FIG. 8) is ended. Otherwise the remote basic meters RBM are placed in a list L of remote basic meters RBM potentially subject to the energy-consumption fraud.

In a step 803, the metrology control module MCTRL 315 recovers information on the state of each remote basic meter RBM identified at the step 802, which is obtained by sending an atomic command frame to said remote basic meter RBM by the emulated application EAPP instanciated for said remote basic meter RBM. In return, each remote basic meter RBM concerned transmits a response frame that includes the information on the state of said remote basic meter RBM. In particular, the response frame comprises information indicating whether the breaker member is open or closed, and information indicating whether said remote basic meter RBM concerned has detected that the downstream breaker DBRK of the electrical installation that said remote basic meter RBM is responsible for supervising is open or closed.

In a step 804, the metrology control module MCTRL 315 excludes from the list L any remote basic meter RBM the state of which, as obtained at the step 803, shows that the electrical supply of the electrical installation supervised by said remote basic meter RBM has been cut off by opening the breaker member BRK 355 of said remote basic meter RBM and/or of the downstream breaker DBRK of said electrical installation. This is because, for any remote basic meter RBM thus excluded, the drop to zero of the electrical consumption is then considered to be related to the cutting off of the electrical supply of the electrical installation supervised by said remote basic meter RBM. If only one remote basic meter RBM remains in the list L at the end of the step 804, the metrology control module MCTRL 315 has identified the remote basic meter RBM subject to the energy-consumption fraud, and the algorithm (not shown in FIG. 8) is ended.

In a step 805, the metrology control module MCTRL 315 performs extrapolations of the load curves of the remote basic meters RBM remaining in the list L. The extrapolations consist in estimating what would have been the energy consumptions of said remote basic meters RBM if there had been no drop to zero. In a particular embodiment, the metrology control module MCTRL 315, in making each extrapolation, considers the load curve in question over a period equal to T/2 until the moment when the energy consumption thereof drops to zero.

In a step 806, the metrology control module MCTRL 315 makes a calculation of estimated total consumption, in the form of active energy $\Delta Ea_E$, from each extrapolation made in the step 805. This gives the same number of calculations of estimated total consumption $\Delta Ea_E$ as there are remote basic meters RBM in the list L. The estimated total consumption $\Delta Ea_E$ calculated may include the predetermined intrinsic consumption $\Delta E_C$ of the remote basic meters RBM 131, 132, 133 actually attached to the concentrating meter CM 120.

In a step 807, the metrology control module MCTRL 315 identifies which is the remote basic meter RBM in the list L to which the detected energy-consumption fraud relates, namely the remote basic meter RBM in the list L for which the estimated total consumption $\Delta Ea_E$ is closest to the measured total consumption $\Delta Ea_G$ (as determined in the context of the algorithm in FIG. 6). In a particular embodiment, the metrology control module MCTRL 315 to do this seeks the remote basic meter RBM in the list L for which the following expression is minimum:

$$\left|1 - \frac{\Delta Ea_E}{\Delta Ea_G}\right|$$

In yet another particular embodiment, the metrology control module MCTRL 315 identifies which is the remote basic meter RBM in the list L to which the detected energy-consumption fraud relates, by seeking the remote basic meter RBM in the list L for which the following ratio is maximum:

$$\frac{\Delta Ea_E}{\Delta Ea_G}$$

It is therefore supposed that there is only one fraudster among the remote basic meters RBM 131, 132, 133 attached to the centralising meter CM 120, since it can reasonably be supposed that, in the case of a plurality of parallel and independent frauds, the instants of starts of frauds are not correlated and even less simultaneous. Thus, when the ratio of the declared energy consumption $\Delta Ea_D$ by all the remote basic meters RBM 131, 132, 133 during the time T to the energy consumption $\Delta Ea_G$ measured by the general metrology unit GMTR 320 during the time T is below the predefined threshold TH and when furthermore the load curves of a plurality of these remote basic meters RBM show a drop to zero of the energy consumption, the metrology control module MCTL 315 identifies which remote basic meter RBM is subject to an energy-consumption fraud, by extrapolating the load curves of said plurality of remote basic meters RBM and by comparing the total consumptions $\Delta Ea_E$ estimated from the extrapolated load curves with the energy consumption $\Delta Ea_G$ measured by the general metrology unit GMTR 320.

The invention claimed is:

1. A method implemented by a centralising meter included in an automated metering management system in the context of an electrical distribution service, the centralising meter comprising a first powerline communication unit configured for communicating with a data concentrator via a first powerline communication network in a first frequency band, wherein the centralising meter further comprising a second powerline communication unit configured for communicating with a plurality of devices, called remote basic meters, via a second powerline communication network (101) in a second frequency band distinct from the first frequency band, the method comprises:

emulating a smart electricity meter application with respect to the data concentrator for each remote basic meter registered with the centralising meter via the second powerline communication network, each emulated application constructing a load curve for the corresponding remote basic meter;

measuring, by a general metrology unit of the centralising meter, an electrical consumption of all electrical installations that the remote basic meters are responsible for supervising; and when the $\Delta Ea_D/\Delta Ea_G$ ratio of an energy consumption $\Delta Ea_D$ declared by all the remote basic meters during a time T to an energy consumption $\Delta Ea_G$ measured by the general metrology unit during the time T is below a predefined threshold and furthermore the load curves of a plurality of remote basic meters show a drop to zero of the energy consumption, identifying which remote basic meter is subject to an energy-consumption fraud, by extrapolating the load curves of said plurality of remote basic meters and comparing total energy consumptions $\Delta Ea_E$ estimated from the extrapolated load curves with said energy consumption $\Delta Ea_G$.

2. The method according to claim 1, wherein the estimated energy consumption $\Delta Ea_E$ includes a predetermined intrinsic consumption $\Delta E_C$ of the remote basic meters.

3. The method according to claim 1, wherein the centralising meter identifies the remote basic meter subject to the energy-consumption fraud as being the remote basic meter for which the estimated energy consumption $\Delta Ea_E$ is closest to the measured energy consumption $\Delta Ea_G$.

4. The method according to claim 3, wherein the centralising meter identifies the remote basic meter subject to the energy-consumption fraud as being the remote basic meter for which the following expression is minimum:

$$\left|1 - \frac{\Delta Ea_E}{\Delta Ea_G}\right|.$$

5. The method according to claim 1, wherein the centralising meter identifies the remote basic meter subject to the energy-consumption fraud as being the remote basic meter for which the following ratio is maximum:

$$\frac{\Delta Ea_E}{\Delta Ea_G}.$$

6. The method according to claim 1, wherein, when the load curves of the plurality of remote basic meters show that the energy consumption has dropped to zero, the centralising meter performs the following steps:

recovering information on a state of each remote basic meter the load curve of which shows that the energy consumption has dropped to zero, by sending a dedicated atomic command frame to said remote basic meter by the emulated application instanciated for said remote basic meter; and excluding from the extrapolations the load curve of each remote basic meter a recovered state information of which indicates that a breaker member of said remote basic meter is open and/or a downstream breaker of the electrical installation that said remote basic meter is responsible for supervising is open.

7. The method according to claim 1, wherein the centralising meter, in performing each extrapolation, considers the load curve in question over a period equal to T/2 until the moment when the energy consumption drops to zero, where T represents a period between two successive metering index readings by the general metrology unit for determining the energy consumption $\Delta Ea_G$.

8. A non-transitory storage medium, that stores a computer program comprising instructions causing execution by a centralising meter of the method according to claim 1, when said instructions are read and executed by a processor of said centralising meter.

9. A centralising meter intended to be included in an automated metering management system in the context of an electrical distribution service, the centralising meter comprising:

a first powerline communication unit configured for communicating with a data concentrator via a first powerline communication network in a first frequency band, a second powerline communication unit configured for communicating with a plurality of devices, called remote basic meters, via a second powerline communication network in a second frequency band distinct from the first frequency band, a control unit configured for emulating a smart electricity meter application with respect to the data concentrator for each remote basic meter registered with the centralising meter via the second powerline communication network, each emulated application constructing a load curve for the corresponding remote basic meter, a general metrology unit responsible for reading an electrical consumption of all electrical installations that the remote basic meters are responsible for supervising, and in that the control unit comprises a metrology control module which, when the ratio $\Delta Ea_D/\Delta Ea_G$ of an energy consumption $\Delta Ea_D$ declared by all the remote basic meters during a time T to an energy consumption $\Delta Ea_G$ measured by the general metrology unit during the time T is below a predefined threshold and when furthermore the load curves of a plurality of remote basic meters show that the energy consumption has dropped to zero, is configured for identifying which remote basic meter is subject to an energy-consumption fraud, by extrapolating the load curves of said plurality of remote basic meters and comparing total consumptions $\Delta Ea_E$ estimated from the load curves extrapolated with said energy consumption $\Delta Ea_G$.

\* \* \* \* \*